(12) United States Patent
Wong et al.

(10) Patent No.: US 6,414,361 B2
(45) Date of Patent: Jul. 2, 2002

(54) BURIED SHALLOW TRENCH ISOLATION AND METHOD FOR FORMING THE SAME

(75) Inventors: Shyh-Chyi Wong; Shi-Tron Lin, both of Hsinchu (TW)

(73) Assignee: Winbond Electronics Corporation (TW)

(*) Notice: Subject to any disclaimer, the term of this patent is extended or adjusted under 35 U.S.C. 154(b) by 0 days.

(21) Appl. No.: 09/754,145

(22) Filed: Jan. 5, 2001

Related U.S. Application Data

(63) Continuation of application No. 09/175,576, filed on Oct. 20, 1998, now Pat. No. 6,246,094.

(51) Int. Cl.$^7$ .......................... H01L 29/76; H01L 29/00
(52) U.S. Cl. .................... 257/374; 257/510; 257/513
(58) Field of Search .......................... 257/510, 513, 257/514, 515, 374, 347, 522, 617, 77; 438/443, 424, 207

(56) References Cited

U.S. PATENT DOCUMENTS

| | | | |
|---|---|---|---|
| 4,902,639 A | 2/1990 | Ford | 437/56 |
| 5,326,991 A | 7/1994 | Takasu | 257/77 |
| 5,675,176 A | * 10/1997 | Ushiku et al. | 257/510 |
| 5,677,564 A | 10/1997 | McCormack et al. | 257/522 |
| 5,712,185 A | 1/1998 | Tsai et al. | 437/67 |
| 5,721,173 A | 2/1998 | Yano et al. | 438/424 |
| 5,767,549 A | 6/1998 | Chen et al. | 257/347 |
| 5,937,311 A | 8/1999 | Nagatomo | 438/443 |

\* cited by examiner

*Primary Examiner*—Steven Loke
(74) *Attorney, Agent, or Firm*—Finnegan, Henderson, Farabow, Garrett & Dunner, L.L.P.

(57) ABSTRACT

An integrated semiconductor device includes a substrate having a buried shallow trench isolation structure and an epitaxial layer disposed over the substrate and the buried shallow trench isolation structure. The epitaxial layer includes a shallow trench isolation structure that extends over the buried shallow trench isolation structure in the substrate to substantially reduce leakage current in the substrate to prevent device latch-up.

6 Claims, 3 Drawing Sheets

BURIED SHALLOW TRENCH ISOLATION AND METHOD FOR FORMING THE SAME

This application is a continuation of application Ser. No. 09/175,576, filed on Oct. 20, 1998, now U.S. Pat. No. 6,246,094.

BACKGROUND OF THE INVENTION

1. Field of the Invention

This invention pertains in general to a shallow trench isolation structure and a method for forming the same to isolate active regions within a semiconductor device and, more particularly, to a burled shallow trench isolation structure and a method for forming the same to prevent latch-up in a complementary metal-oxide semiconductor ("CMOS") integrated circuit.

2. Description of the Related Art

A CMOS integrated circuit device, by definition, includes at least one n-type metal-oxide semiconductor ("NMOS") formed in a p-well region and one p-type metal-oxide semiconductor ("PMOS") formed in an n-well region of the device. FIG. 1 shows a conventional CMOS device. Referring to FIG. 1, an NMOS includes source and drain regions, a channel region therebetween, an n-type gate NGate separated from the channel region by a gate oxide, and oxide or nitride spacers on the sides of n-type gate NGate. Each of the drain and source regions includes a lightly-doped region n$^-$ and a heavily-doped region n$^+$. Similarly, a PMOS includes source and drain regions, a channel region therebetween, a p-type gate PGate separated from the channel region by a gate oxide, and oxide or nitride spacers on the sides of p-type gate PGate. Each of the drain and source regions includes a lightly-doped region p$^-$ and a heavily-doped region p$^+$.

The formation of the n-type and p-type MOS field-effect transistors ("MOSFETs") leads to the formation of parasitic bipolar junction transistors ("BJTs"). During normal device operations, parasitic transistors are not turned-on and therefore do not affect device operations. However, under certain transient conditions, such as voltage surges, parasitic BJTs may be turned-on and the device is said to be "latched-up."

A parasitic BJT may be turned-on by migrating charge carriers, such as holes migrating to the base, or the n-well region, of a pnp BJT, and electrons migrating to the base, or the p-well region, of an npn BJT. Charge carriers can also migrate from the substrate beneath the active regions of the CMOS circuit. In addition, because the collector of a pnp BJT is connected to the base of an npn BJT and the collector of the npn BJT is connected to the base of the pnp BJT, when one parasitic BJT is turned-on by the migrating charge carriers, the other BJT will also be turned on. Further, if one npn-pnp BJT pair is turned-on, other parasitic BJT pairs in the device will likewise be turned-on, thereby creating a feedback loop within the device. Such a feedback loop consumes power, reduces device speed, and sometimes renders the device inoperative. Once formed, the feedback loop cannot be severed easily. The probability of latch-up increases as device size becomes smaller because undesired charge carriers that create the latch-up triggering current have a greater chance of reaching the areas of the device to trigger latch-up.

Latch-ups may be prevented by stopping the migration of charge carriers or substantially reducing the number of migrating charge carriers. Two known methods have been employed to prevent latch-ups. One method places insulating materials in the shallow surface between active regions of the device to act as barriers to carrier charge flow. These insulating barriers are known as shallow trench isolation ("STI") structures. The other known method employs "guard rings," or heavily doped materials, that act as "sinks" to divert the undesired charge carriers away from the parasitic BJTs. Guard rings are inserted from the surface to form vertical barriers to charge carrier flow.

Because the depth of the STIs and guard rings is limited by the fabrication process, charge carriers, may still migrate underneath them and therefore neither method, by itself or in combination, effectively prevents the flow of carriers to or from the substrate. This charge carrier flow is also known as leakage current. As shown in FIG. 1, although the flow of carriers between the p- and n-wells is prevented by the combination of STIs and guard rings, leakage current flows through the substrate between the n-well and p-well regions.

SUMMARY OF THE INVENTION

Accordingly, the present invention is directed to a buried shallow trench isolation structure and a method for forming the same that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawings.

To achieve these and other advantages, and in accordance with the purpose of the invention as embodied and broadly described, there is provided an integrated circuit device that includes a substrate and a layer of single-crystal semiconductor material disposed over the substrate. The integrated circuit device also includes a first isolation structure of dielectric material formed within the substrate. The first isolation structure is in contact with the layer and its thickness is less than that of the substrate. The integrated circuit device additionally includes a second isolation structure of dielectric material formed within the layer and extends over the first isolation structure to reduce leakage current in the substrate.

In another aspect, the first isolation structure of the invention is in contact with the second isolation structure.

In yet another aspect, the invention may be defined by:

$$\frac{D-G}{E} \le 0.3$$

where D is the thickness of the layer, G is the thickness of the second isolation structure and E is the width of the second isolation structure.

Also in accordance with the invention, there is provided an integrated semiconductor device that includes a semiconductor substrate having a first thickness and a layer of single-crystal semiconductor material disposed over the substrate that includes at least one n-well region and at least one p-well region adjacent the n-well region. The integrated semiconductor device also includes a first isolation structure formed within the substrate and in contact with the layer wherein the first isolation structure is dielectric and has a thickness less than the first thickness, and a second isolation structure formed within the layer and disposed between the n-well region and the p-well region wherein the second isolation structure is dielectric. In addition, the second isolation structure extends over the first isolation structure to substantially reduce leakage current in the substrate to prevent device latch-up and to isolate the n-well region from the p-well region.

Further in accordance with the invention, there is provided a method for forming a buried shallow trench isolation structure that includes the steps of defining a substrate, forming at least one trench on the substrate, providing a dielectric material in the trench to form a first isolation structure, growing an epitaxial layer over the substrate and the first isolation structure, forming at least one trench in the epitaxial layer wherein the trench of the epitaxial layer extends over the first isolation structure, and providing a dielectric material in the trench of the epitaxial layer to form a second isolation structure.

In one aspect of the invention, the step of providing a dielectric material to form a first isolation structure includes a step of oxidation.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DETAILED DESCRIPTION OF THE PREFERRED EMBODIMENTS

Figure 1:
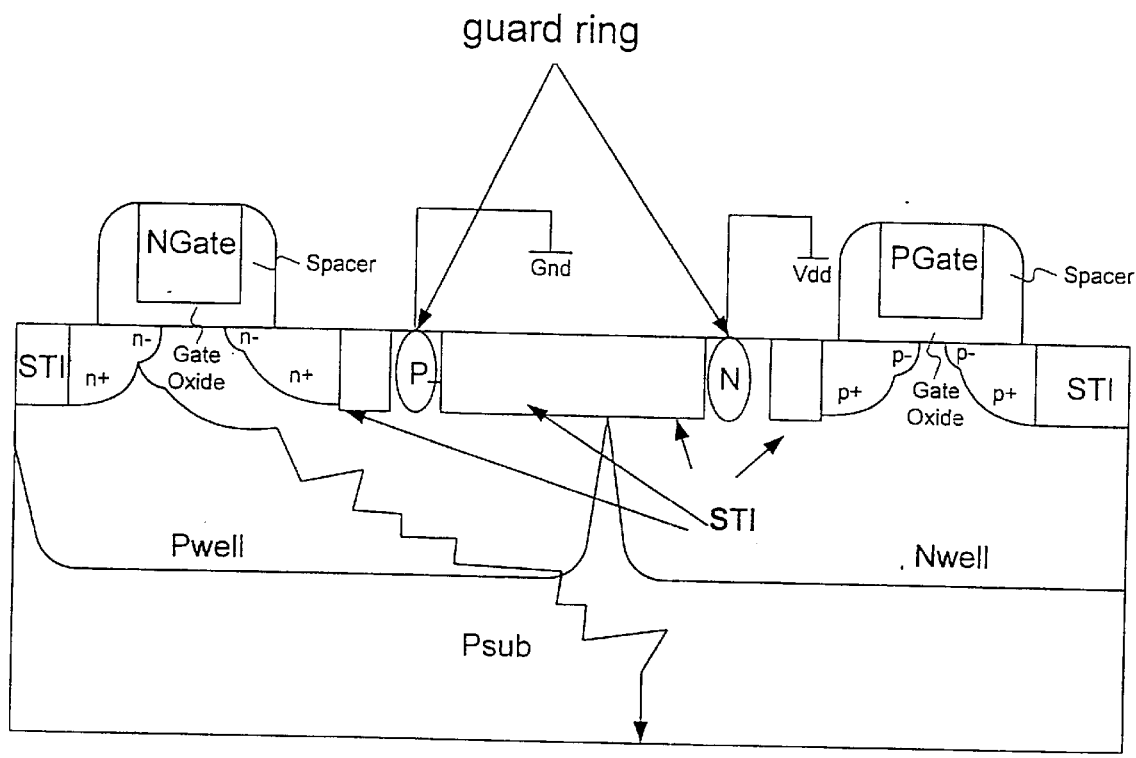
FIG. 1 shows a cross-sectional view of a twin-well CMOS device with STIs and guard rings and the flow of undesired charge carrier in the substrate region.

In accordance with the present invention, a buried STI ("BSTI") is formed to disconnect the base of a parasitic npn BJT from the collector of a parasitic pnp BJT and the base of the parasitic pnp BJT from the collector of the parasitic npn BJT. The BSTI also prevents charge carrier flow underneath STIs and guard rings, and reduces leakage current in the device substrate.

A BSTI is a shallow trench isolation structure recessed in and is substantially planar with the device substrate and may be formed in the substrate of any integrated circuit device where latch-up presents a problem. Having a thickness less than that of the substrate, a BSTI may be composed of any known dielectric material such as silicon dioxide, silicon nitride, or silicon oxynitride.

Disposed over the substrate and the BSTI is an epitaxial layer, or a substantially single-crystal semiconductor layer, that includes active regions of the device. Since the BSTI is recessed in and planar with the substrate, the BSTI is in contact with the epitaxial layer. For a twin-well CMOS device, the layer generally includes a plurality of STIs, each separating an n-well region from an adjacent p-well region within the CMOS device. The STIs may be composed of a dielectric material, such as silicon dioxide, silicon nitride, or silicon oxynitride. To effectively isolate adjacent n-well and p-well regions and prevent substrate leakage current, more than one STI may extend over the BSTI but at least one of the plurality of STIs should extend over the BSTI. The distance between the STI and BSTI must be close enough so that charge carriers cannot migrate therebetween, and it is preferred that the STI be in physical contact with the BSTI. If the STI and BSTI are not in contact, the width of the STI becomes an important factor that must be considered to practice the present invention. More than one BSTI may be formed to separate the active regions.

When the STI and BSTI are physically in contact, the resistance in the region approaches infinity, which completely isolates the n-well and p-well regions. However, because of device manufacturing limitations, the STI and BSTI are likely to be separate components. Assuming the width of the STI remains constant, as the distance between the STI and BSTI increases, the resistance in the region decreases exponentially until the STI and BSTI no longer isolate the n- and p-well regions or sufficiently reduce leakage current in the substrate to prevent device latch-up. However, the decrease in the effectiveness of the BSTI and STI pair may be compensated by increasing the width of the STI, as expressed in the following formula for a CMOS device manufactured with a 0.35 micron process:

$$\frac{D-G}{E} \leq 0.3$$

where D is the thickness of the epitaxial layer within which the STI is disposed, G is the thickness of the STI and E is the width of the STI.

When D−G=0, meaning the STI is in physical contact with the BSTI, the required STI width is only infinitesimal because, as discussed above, a connected STI and BSTI will completely isolate the n- and p-well regions.

A process of the present invention will now be explained with reference to FIGS. 2A—2D. The process used to describe the present invention is a 0.35 micron process, although one skilled in the art would understand that the parameters described below are for illustrative purposes only and adjustments will need to be made for different processes.

Figure 2A:
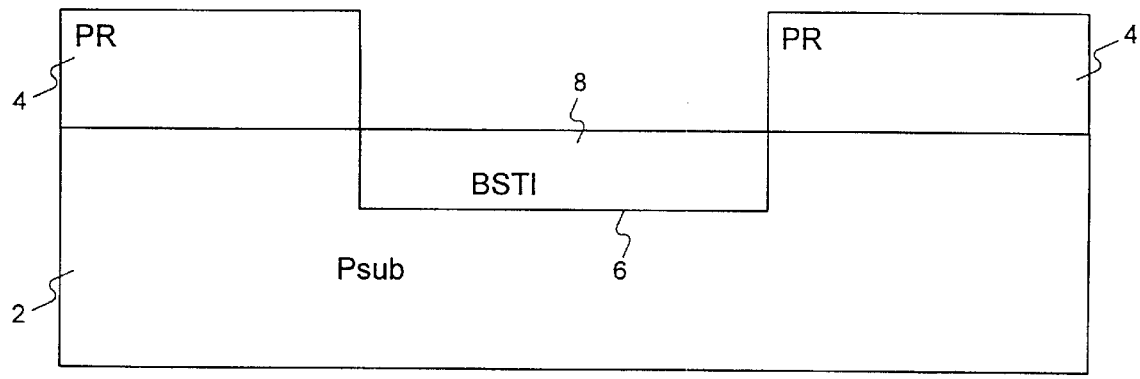
FIGS. 2A–2D are cross-sectional views of the steps in a method of forming a buried STI in a CMOS device.

Referring to FIG. 2A, a process of the present invention begins by defining a p-type substrate 2. A photoresist 4 is applied on the surface of substrate 2 and patterned to remove portions of photoresist 4 where BSTIs are to be formed. For illustrative purposes, FIGS. 2A–2D show the formation of only one BSTI. Using photoresist 4 as a mask, substrate 2 is etched to remove a portion to form a trench 6. Silicon dioxide is then grown inside trench 6 through oxidation to form a BSTI 8. Alternatively, other dielectric materials such as silicon dioxide and silicon nitride may be deposited in trench 6 through a conventional chemical vapor deposition ("CVD") process to form BSTI 8. BSTI 8 has a thickness between 0.1 and 1 micron and a width between 0.1 and 2 microns. Photoresist 4 is then removed. Planarization steps may be employed to ensure the surfaces of substrate 2 and BSTI 8 are planar.

Figure 2B:
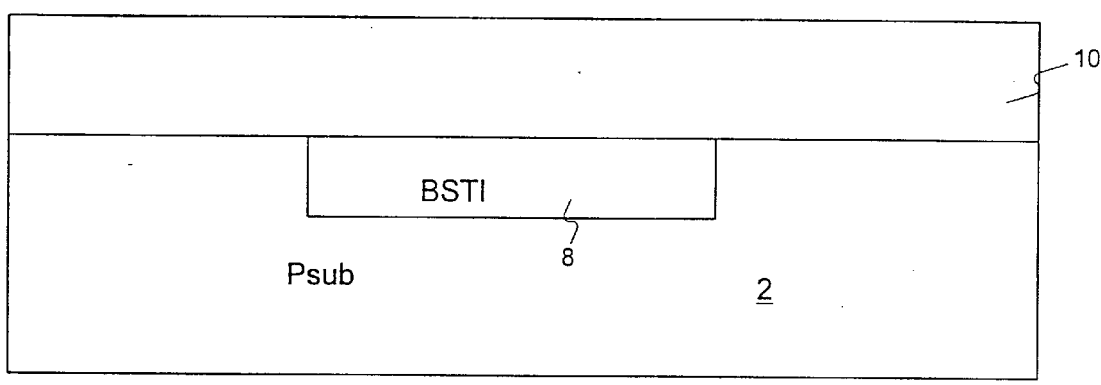
Figure 2C:
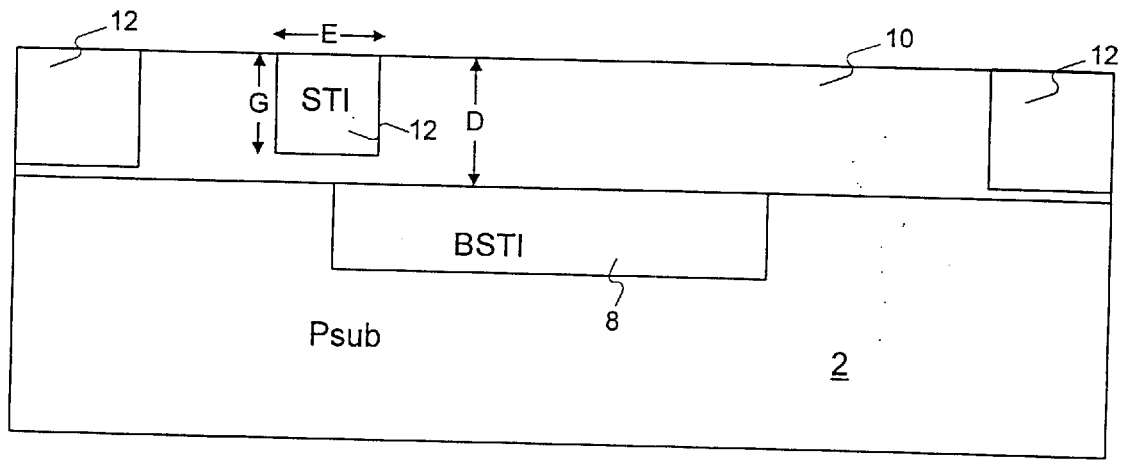

Referring to FIG. 2B, a p-type epitaxial layer 10 of single-crystal silicon is grown over substrate 2 and BSTI 8. Epitaxial layer 10 has a thickness between 0.1 and 1 micron. FIG. 2C shows the formation of STIs 12 in epitaxial layer 10. The same steps already described to form BSTI 8 are repeated to etch trenches in epitaxial layer 10 and to form STIs 12. As discussed above, the effectiveness of BSTI 8 and STI 12 pair in isolating n- and p-well regions and reducing leakage current depends on the distance between the BSTI and STI and the width of STI. The width of STI 12 is approximately 0.1 to 1 micron and the distance between STI 12 and BSTI 8 is approximately 0 to 0.9 microns.

Figure 2D:
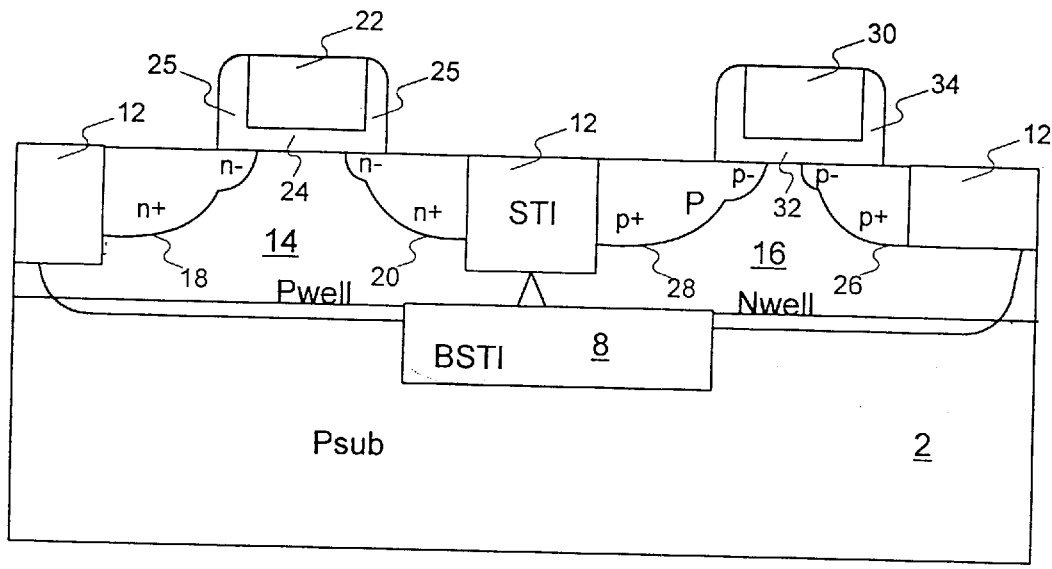

Referring to FIG. 2D, transistors are then formed through conventional processes. Specifically, epitaxial layer 10 is doped to form a p-well region 14 and an n-well region 16. Specifically, p-well region 14 is formed by doping a p-type dopant such as boron B or $BF_2$ at a dose of approximately between $5 \times 10^{11}$ to $5 \times 10^{13}$ per $cm^2$, and n-well region 16 is formed by doping an n-type dopant such as arsenic As or phosphorous P at a dose of approximately between $5 \times 10^{11}$ to $5 \times 10^{13}$ per $cm^2$, both at an energy of approximately between 40 KeV to 120 KeV.

P-well region 14 includes spaced-apart n-type regions 18 and 20 that serve as drain and source regions, a channel region (not numbered) between spaced-apart regions 18 and 20, and STIs contiguous with spaced-apart regions 18 and 20. A gate structure including gate 22, gate insulator 24 and spacer 25 is positioned over the channel region to complete the n-channel MOSFET structure. Similarly, n-well region 16 includes spaced-apart p-type regions 26 and 28 that serve as drain and source regions, a channel region (not numbered) between spaced-apart regions 26 and 28, and STIs contiguous with spaced-apart regions 26 and 28. A gate structure including gate 30, gate insulator 32, and spacer 34 is positioned over the channel region to complete the p-channel MOSFET structure.

Each of spaced-apart regions 18 and 20 includes a lightly-doped region $n^-$ and a heavily-doped region $n^+$. Lightly-doped region $n^-$ may be formed by adding As or P at a dose of approximately between $10^{12}$ to $5 \times 10^{14}$ per $cm^2$ at 5 KeV to 50 KeV, while heavily-doped region $n^+$ may be formed by adding the same dopant at a dose of approximately between $10^{14}$ to $5 \times 10^{15}$ per $cm^2$ at 5 KeV to 80 KeV. Similarly, each of spaced-apart regions 26 and 28 includes a lightly-doped region $p^-$ and a heavily-doped region $p^+$. Lightly-doped region $p^-$ may be formed by adding B or $BF_2$ at a dose of approximately between $10^{12}$ to $5 \times 10^{14}$ per $cm^2$ at 5 KeV to 50 KeV, while heavily-doped region $p^+$ may be formed by adding the same dopant at a dose of approximately between $10^{14}$ to $5 \times 10^{15}$ per $cm^2$ at 5 KeV to 80 KeV.

In operation, the leakage current of the CMOS circuit is substantially reduced and the base of a parasitic npn BJT is separated from the collector of a parasitic pnp BJT, and the base of the parasitic pnp BJT is separated from the collector of the parasitic npn BJT to prevent device latch-up.

Although the foregoing discussion is limited to components of specific conductivity-types manufactured with a 0.35-micron process, the present invention should not be limited to the foregoing components and process. It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein.

It is intended that the specification and examples be considered as exemplary only, with a true scope and spirit of the invention being indicated by the following claims.

What is claimed is:

1. An integrated semiconductor device, comprising:

a semiconductor substrate having a first thickness;

a first isolation structure formed in said substrate, said first isolation structure being dielectric and having a second thickness less than said first thickness, said first isolation structure having a width larger than said second thickness;

a layer of semiconductor material disposed over said substrate and said first isolation structure, said layer of semiconductor material being in contact with an upper surface of said substrate and an upper surface of said first isolation structure, said first isolation structure not extending into said layer, said layer including at least one n-well region; and at least one p-well region adjacent said n-well region; and a second isolation structure formed within said layer and disposed between said n-well region and said p-well region, said second isolation structure being dielectric;

wherein said second isolation structure extends over said first isolation structure to substantially reduce leakage current in said substrate to prevent device latch-up and to isolate said n-well region from said p-well region.

2. The device as claimed in claim 1 wherein said first isolation structure is in contact with said second isolation structure.

3. The device as claimed in claim 1 wherein $$\frac{D - G}{E} \leq 0.3$$

where D is the thickness of said layer, G is the thickness of said second isolation structure and E is the width of said second isolation structure.

4. The device as claimed in claim 1 wherein said first isolation structure is silicon dioxide, silicon nitride, or silicon oxynitride.

5. The device as claimed in claim 1 wherein said second isolation structure is silicon dioxide, silicon nitride, or silicon oxynitride.

6. The device as claimed in claim 1, wherein said first isolation structure is within said semiconductor substrate and said upper surface of said first isolation structure and said upper surface of said substrate are substantially coplanar.

* * * * *